(12) United States Patent
Kurita et al.

(10) Patent No.: US 7,538,022 B2
(45) Date of Patent: May 26, 2009

(54) METHOD OF MANUFACTURING ELECTRONIC CIRCUIT DEVICE

(75) Inventors: Yoichiro Kurita, Kanagawa (JP); Koji Soejima, Kanagawa (JP); Masaya Kawano, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 231 days.

(21) Appl. No.: 11/528,422

(22) Filed: Sep. 28, 2006

(65) Prior Publication Data

US 2007/0020804 A1 Jan. 25, 2007

(30) Foreign Application Priority Data

Oct. 7, 2005 (JP) ............... 2005-294713

(51) Int. Cl.
*H01L 21/44* (2006.01)
*H01L 21/4763* (2006.01)
*H01L 21/00* (2006.01)

(52) U.S. Cl. ............... 438/614; 438/612; 438/106; 438/622; 438/625; 257/E21.507; 257/E21.627

(58) Field of Classification Search ............... 438/612, 438/613, 614, 620, 622, 625, 106; 257/E21.507, 257/E21.627
See application file for complete search history.

(56) References Cited

U.S. PATENT DOCUMENTS 5,756,395 A * 5/1998 Rostoker et al. ............ 438/622

| | | | |
|---|---|---|---|
| 6,178,082 B1 * | 1/2001 | Farooq et al. ............... 361/303 |
| 6,222,212 B1 * | 4/2001 | Lee et al. .................... 257/207 |
| 6,706,546 B2 * | 3/2004 | Yoshimura et al. ........... 438/31 |
| 6,759,738 B1 * | 7/2004 | Fallon et al. ................ 257/690 |
| 7,087,458 B2 * | 8/2006 | Wang et al. ................ 438/108 |
| 2004/0155358 A1 * | 8/2004 | Iijima ........................ 257/778 |

FOREIGN PATENT DOCUMENTS

JP  5-144816  6/1993

OTHER PUBLICATIONS

Chinese Office Action dated Feb. 15, 2008 with English Translation.

* cited by examiner

*Primary Examiner*—Alexander G Ghyka
*Assistant Examiner*—Seahvosh J Nikmanesh
(74) *Attorney, Agent, or Firm*—McGinn IP Law Group, PLLC

(57) ABSTRACT

The method of manufacturing an electronic circuit device according to an embodiment of the present invention includes preparing an interconnect substrate 10 including an interconnect 14 and an electrode pad 16 integrally formed with the interconnect 14; preparing an electronic circuit chip 20 including a solder electrode 22; and melting the solder electrode 22 and connecting it to the electrode pad 16, thus connecting the interconnect substrate 10 and the electronic circuit chip 20. A first metal material, exposed in the surface of the electrode pad 16 opposite to an insulating resin layer 12 and constituting the electrode pad 16, has higher free energy for forming an oxide than a second metal material exposed in the surface of the interconnect 14 opposite to the insulating resin layer 12 and constituting the interconnect 14.

20 Claims, 10 Drawing Sheets

METHOD OF MANUFACTURING ELECTRONIC CIRCUIT DEVICE

This application is based on Japanese patent application No. 2005-294713, the content of which is incorporated hereinto by reference.

BACKGROUND

1. Technical Field

The present invention relates to a method of manufacturing an electronic circuit device.

2. Related Art

A conventional method of manufacturing an electronic circuit device can be found, for example, in Japanese Laid-open patent publication No. H05-144816. FIG. 10 is a cross-sectional view showing an electronic circuit device manufactured by the method disclosed therein. The electronic circuit device shown in FIG. 10 is obtained by connecting an interconnect substrate 100 and a semiconductor chip 110. In the interconnect substrate 100, an interconnect 103 and an electrode pad 104 are provided on a base material 101, via an adhesive 102. The interconnect 103 and the electrode pad 104 constitute an integral conductor pattern. On the interconnect 103, a solder resist 105 is provided to prevent solder from flowing over the interconnect 103 when connecting a solder electrode 111 to the electrode pad 104. Thus, the electrode pad 104 is located at an opening in the patterned solder resist 105.

To such interconnect substrate 100, the semiconductor chip 110 is bonded via a flux. To be more detailed, the solder electrode 111 of the semiconductor chip 110 is connected to the electrode pad 104 on the interconnect substrate 100. Then after washing away the flux an underfill resin 120 is loaded in the gap between the interconnect substrate 100 and the semiconductor chip 110. That is how the electronic circuit device shown in FIG. 10 is obtained.

SUMMARY OF THE INVENTION

However, generally the solder resist has low patternability, and is hence not suitable for drawing a highly precise and fine pattern. Accordingly, it is difficult to form the openings for the electrode pad 104 in a fine arrangement pitch. In the electronic circuit device as shown in FIG. 10, therefore, a certain limit is inevitably imposed against arranging the electrode pads 104 in a finer pitch on the base material 101 of the interconnect substrate 100, in other words, against connecting the interconnect substrate 100 and the semiconductor chip 110 in a finer pitch.

According to the present invention, there is provided a method of manufacturing an electronic circuit device comprising preparing an interconnect substrate including an interconnect provided on a base material, and an electrode pad integrally formed with the interconnect on the base material; preparing an electronic circuit chip including a solder electrode; and melting the solder electrode and connecting the solder electrode to the electrode pad, thus connecting the interconnect substrate and the electronic circuit chip; wherein the preparing of the interconnect substrate includes preparing the interconnect substrate in which a first metal material, exposed in a surface of the electrode pad opposite to the base material and constituting the electrode pad, has higher free energy for forming an oxide than a second metal material exposed in a surface of the interconnect opposite to the base material and constituting the interconnect.

This method includes preparing the interconnect substrate in which a metal material (first metal material) having relatively high free energy for forming an oxide is exposed in the surface of the electrode pad, while another metal material (second metal material) having relatively low free energy is exposed in the surface of the interconnect. Accordingly, the surface of the interconnect of the interconnect substrate is more susceptible to oxidation than the surface of the electrode pad. Generally a metal oxide layer has lower solder-wettability than the metal, and hence the solder-wettability of the interconnect region becomes lower than that of the electrode pad region when the metal oxide layer is formed on the surface of the interconnect. Accordingly, the solder is prevented from flowing into the interconnect region from the electrode pad region, when connecting the solder electrode of the electronic circuit chip to the electrode pad. The foregoing method, therefore, eliminates the need to employ an interconnect substrate in which a solder resist is provided on the interconnect for preventing the solder from flowing over the interconnect. Consequently, unlike the electronic circuit device shown in FIG. 10, the restriction by the low patternability of the solder resist is no longer imposed on the connection of the interconnect substrate and the electronic circuit chip in a finer pitch.

Further, since the solder electrode is melted when connected to the electrode pad, the use of the flux is no longer necessary for connecting the interconnect substrate and the electronic circuit chip. Accordingly, the metal oxide layer formed on the interconnect can be prevented from being removed by the flux. The foregoing manufacturing method, therefore, further assures the prevention of the solder from flowing into the interconnect region.

Thus, the present invention provides a method of manufacturing appropriate for attaining an electronic circuit device having a structure that allows connecting an interconnect substrate and an electronic circuit chip in a finer pitch.

BRIEF DESCRIPTION OF THE DRAWINGS

The above and other objects, advantages and features of the present invention will be more apparent from the following description taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereunder, an exemplary embodiment of a method of manufacturing an electronic circuit device according to the present invention will be described, referring to the accompanying drawings. In all the drawings, same constituents are given the same numerals, and the description thereof will not be repeated.

Figure 1:
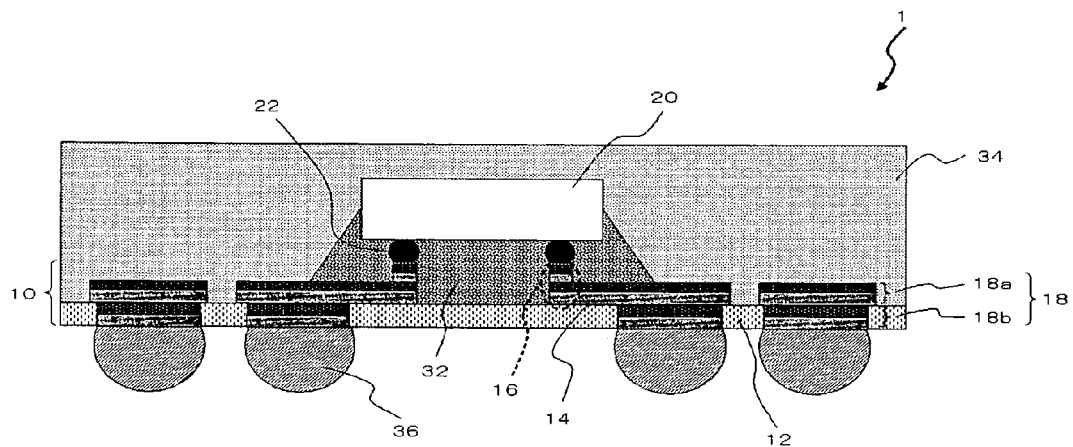
FIG. 1 is a cross-sectional view showing an electronic circuit device fabricated by a manufacturing method according to an embodiment of the present invention.

FIG. 1 is a cross-sectional view showing an electronic circuit device fabricated by a manufacturing method according to an embodiment of the present invention. The electronic circuit device 1 includes an interconnect substrate 10 and an electronic circuit chip 20. The interconnect substrate 10 includes an insulating resin layer 12 (base material), an interconnect 14, and an electrode pad 16.

Examples of resins constituting the insulating resin layer 12 include an epoxy resin and a polyimide resin. On the insulating resin layer 12, the interconnect 14 and the electrode pad 16 are provided. The interconnect 14 and the electrode pad 16 are of an integral structure. To the surface of the electrode pad 16 opposite to the insulating resin layer 12, a solder electrode 22 of the electronic circuit chip 20, to be subsequently described, is connected.

A portion of the interconnect 14 constitutes an external electrode pad 18. To the external electrode pad 18, an external electrode terminal of the electronic circuit device 1 is connected. In this embodiment, the external electrode pad 18 includes an upper pad metal layer 18a and a lower pad metal layer 18b. The upper pad metal layer 18a is provided on the insulating resin layer 12, so as to constitute a part of the interconnect 14. The lower pad metal layer 18b is provided in the insulating resin layer 12. The lower pad metal layer 18b penetrates through the insulating resin layer 12, so that an end thereof is connected to the upper pad metal layer 18a and the other end is exposed in a surface of the insulating resin layer 12. On the other end of the lower pad metal layer 18b, a solder bump 36 is provided as the external electrode terminal of the electronic circuit device 1.

The electronic circuit chip 20 includes the solder electrode 22 serving as the electrode terminal thereof. The solder electrode 22 is connected to the surface (opposite to the insulating resin layer 12) of the electrode pad 16. Accordingly, in the electronic circuit device 1, the electronic circuit chip 20 is placed on the interconnect substrate 10. The solder electrode 22 may be a solder bump, for example. Here, the solder electrode 22 may also be constituted of a base metal portion such as Cu or Ni with a solder layer formed thereon. It is also to be noted that the electronic circuit chip 20 may be just provided with non-semiconductor elements such as resistance elements and capacitor elements, without limitation to a semiconductor chip including semiconductor elements such as transistors.

The gap between the interconnect substrate 10 and the electronic circuit chip 20 is filled with an underfill resin 32. Also, on the interconnect substrate 10, an encapsulating resin 34 is provided. The encapsulating resin 34 covers the lateral surface and the upper surface of the electronic circuit chip 20. Here, the encapsulating resin 34 may cover only the lateral surface of the electronic circuit chip 20, instead of both the lateral and the upper surfaces. In other words, the electronic circuit chip 20 may be exposed in a surface of the encapsulating resin 34.

Figure 2:
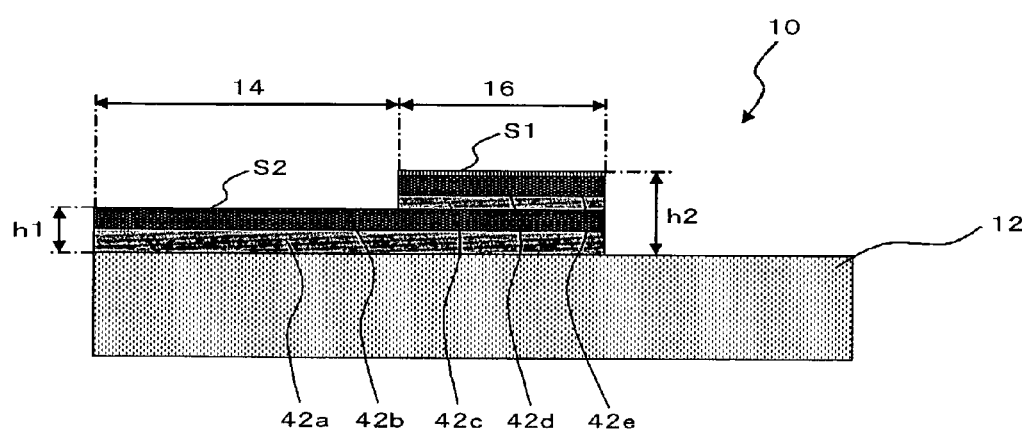
FIG. 2 is a cross-sectional view showing a part of the interconnect substrate in FIG. 1.

Referring to FIG. 2, the structure of the interconnect substrate 10 will be described in further details. FIG. 2 is a cross-sectional view showing a part of the interconnect substrate 10 shown in FIG. 1. The interconnect 14 has a multilayer structure composed of a Cu layer 42a and a Ni layer 42b from the side of the insulating resin layer 12. On the other hand, the electrode pad 16 has a multilayer structure composed of the Cu layer 42a, the Ni layer 42b, another Cu layer 42c, another Ni layer 42d and an Au layer 42e, from the side of the insulating resin layer 12. Thus, the Cu layer 42a and the Ni layer 42b are continuously provided through the interconnect 14 and the electrode pad 16, and constitute the multilayer structures of the interconnect 14 and the electrode pad 16. In other words, the interconnect 14 and the electrode pad 16 share the Cu layer 42a and the Ni layer 42b.

As already stated, the electrode pad 16 includes the Cu layer 42c, the Ni layer 42d and the Au layer 42e in addition to the Cu layer 42a and the Ni layer 42b shared with the interconnect 14. Accordingly, the height h1 of the interconnect 14 from the insulating resin layer 12 and the height h2 of the electrode pad 16 from the insulating resin layer 12 are different from each other. In this embodiment, h1 is lower than h2. Since the interconnect 14 and the electrode pad 16 share the Cu layer 42a and the Ni layer 42b as stated above, the interconnect 14 and the electrode pad 16 have the identical layer structure over the range corresponding to the height h1 from the insulating resin layer 12.

A metal material (first metal material) exposed in the surface (surface S1 in FIG. 2) of the electrode pad 16 opposite to the insulating resin layer 12 and constituting the electrode pad 16 has higher free energy for forming an oxide, as compared with a metal material (second metal material) exposed in the surface (surface S2 in FIG. 2) of the interconnect 14 opposite to the insulating resin layer 12 and constituting the interconnect 14. In this embodiment, the first metal material is Au constituting the Au layer 42e, and the second metal material is Ni constituting the Ni layer 42b. Also, suitable materials for the first metal material include Ag, Pt, and Pd in addition to Au. Examples of the second metal material include Cu, in addition to Ni.

On the surface S2 of the interconnect, a metal oxide layer (not shown) is created from the oxide of the second metal material. The metal oxide layer can be obtained as a natural oxide layer.

Referring to FIGS. 3A through 7, a method of manufacturing the electronic circuit device 1 will be described, as an embodiment of a method of manufacturing an electronic circuit device according to the present invention. The manufacturing method includes preparing the interconnect substrate 10 (substrate preparing step), preparing the electronic circuit chip 20 (chip preparing step), and connecting the interconnect substrate 10 and the electronic circuit chip 20 (connecting step).

Figure 3A:
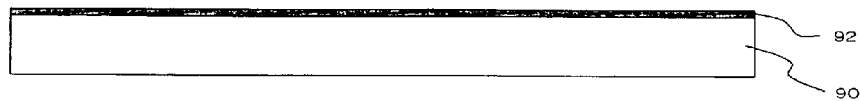
FIGS. 3A and 3B are cross-sectional views sequentially showing a manufacturing process of the electronic circuit device according to the embodiment of the present invention.
Figure 3B:
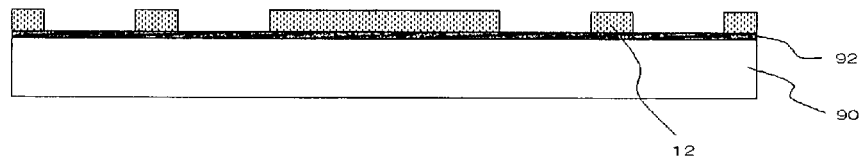

The interconnect substrate 10 may be fabricated as follows. Firstly, a Cu layer 92 is formed by a sputtering process or the like as an intermediate layer, on a silicon wafer 90 serving as the supporting substrate (FIG. 3A). Then the insulating resin layer 12 is formed on the Cu layer 92. At this stage, a portion of the insulating resin layer 12, where the lower pad metal layer 18b is to be provided, is left open (FIG. 3B). Here, employing a photosensitive resin to constitute the insulating resin layer 12 enables forming the insulating resin layer 12 thus patterned, at a low cost.

Figure 4A:
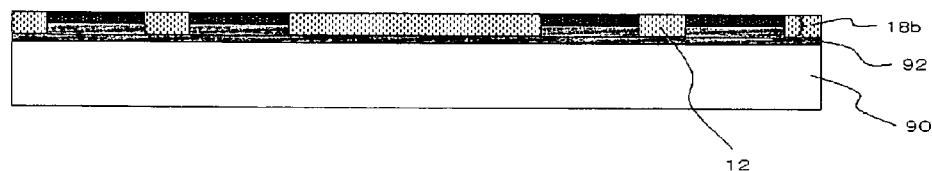
FIGS. 4A and 4B are cross-sectional views sequentially showing a manufacturing process of the electronic circuit device according to the embodiment.
Figure 4B:
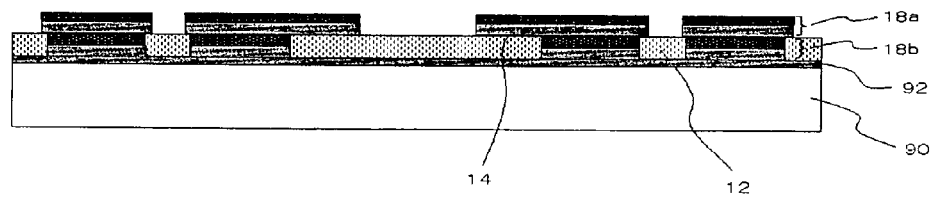

Then a plating process is performed utilizing the Cu layer 92 as the seed layer, to form the lower pad metal layer 18b in the opening of the insulating resin layer 12 (FIG. 4A). This is followed by a semiadditive process to form the interconnect 14 including the upper pad metal layer 18a (FIG. 4B). More specifically, a Cu layer is formed by sputtering on the insulating resin layer 12 where the lower pad metal layer 18b has been formed, via an adhesion metal layer such as Ti or Cr. Then a photoresist is applied and patterned, and a plating process is executed to form a multilayer structure composed of a Cu layer, a Ni layer and a Cu layer sequentially from the side of the insulating resin layer 12, in the opening of the photoresist.

Figure 5A:
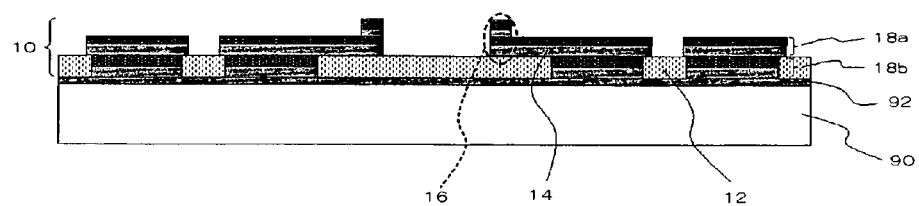
FIGS. 5A and 5B are cross-sectional views sequentially showing a manufacturing process of the electronic circuit device according to the embodiment.

After removing the photoresist, another photoresist is applied. The reapplied photoresist is patterned so as to form an opening at a position where the electrode pad 16 is to be provided. Then a plating process is performed to form a Cu layer, a Ni layer, and a Au layer (in this sequence from the side of the insulating resin layer) in the opening. After that, the Cu layer exposed in the surface of the interconnect 14 is removed by etching. At this stage, the interconnect substrate 10 is obtained (FIG. 5A). Here, when executing the etching to remove the Cu layer, only a portion thereof may be removed, instead of removing the entire Cu layer. In that case, the interconnect 14 attains a multilayer structure composed of the Cu layer, the Ni layer and the Cu layer.

The substrate preparing step and the chip preparing step are followed by the connecting step. Here, the relative sequence of the substrate preparing step and the chip preparing step may be determined as desired. That is, either step may be executed before the other, or the both steps may be executed at a time.

In the connecting step, the solder electrode 22 is melted and connected to the electrode pad 16, to thereby connect the interconnect substrate 10 and the electronic circuit chip 20. This step may be performed by a local reflow process, for example. By the local reflow process, the solder electrode 22 is held by a bonding tool and positioned with respect to the interconnect substrate 10, and then the electronic circuit chip 20 is heated via the bonding tool. Then the solder electrode 22 now melted by heating is connected to the electrode pad 16, thus to connect the interconnect substrate 10 and the electronic circuit chip 20. In this embodiment, the interconnect substrate 10 and the electronic circuit chip 20 are combined without the intermediation of the flux. Also, it is preferable to execute the connecting step in an inert gas atmosphere, such as nitrogen gas.

Figure 5B:
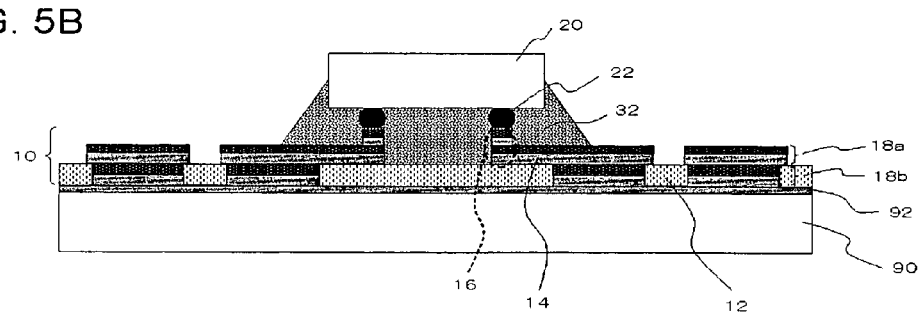

After the connecting step, the underfill resin 32 is injected into the gap between the interconnect substrate 10 and the electronic circuit chip 20, so as to encapsulate the connection point therebetween with the resin (FIG. 5B).

Figure 6A:
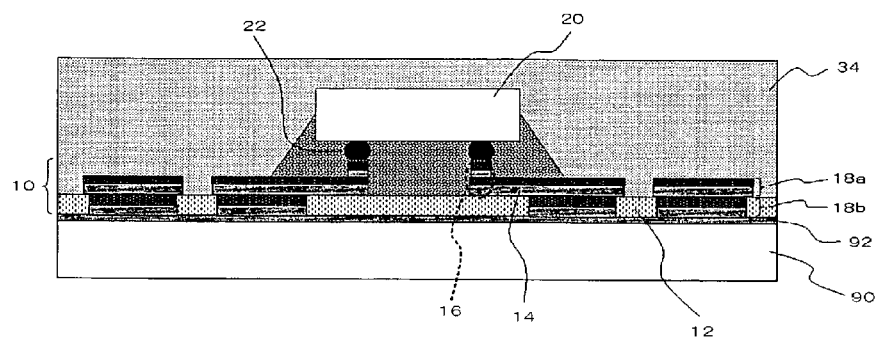
FIGS. 6A and 6B are cross-sectional views sequentially showing a manufacturing process of the electronic circuit device according to the embodiment.
Figure 6B:
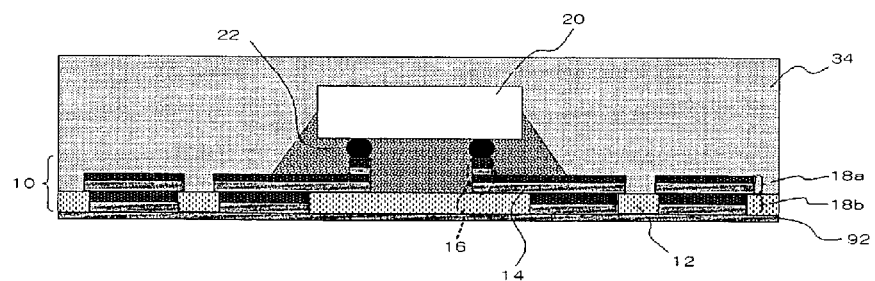

Further, a transfer mold process, printing process, potting process or the like is performed to form the encapsulating resin 34 on the interconnect substrate 10, so as to cover the electronic circuit chip 20 (FIG. 6A). Thereafter the silicon wafer 90 is removed (FIG. 6B). To remove the silicon wafer 90, it is preferable to perform grinding, chemical mechanical polishing (CMP) or an etching process, or a combination thereof. For example, after grinding the silicon wafer 90, the remaining portion may be removed by the CMP or etching, or the both. Also, the etching process may be a dry etching or wet etching process. It is to be noted that employing the dry etching at the stage of entirely removing the remaining portion of the silicon wafer 90 allows utilizing a large etching selection ratio, thereby facilitating stably preserving the Cu layer 92.

Figure 7:
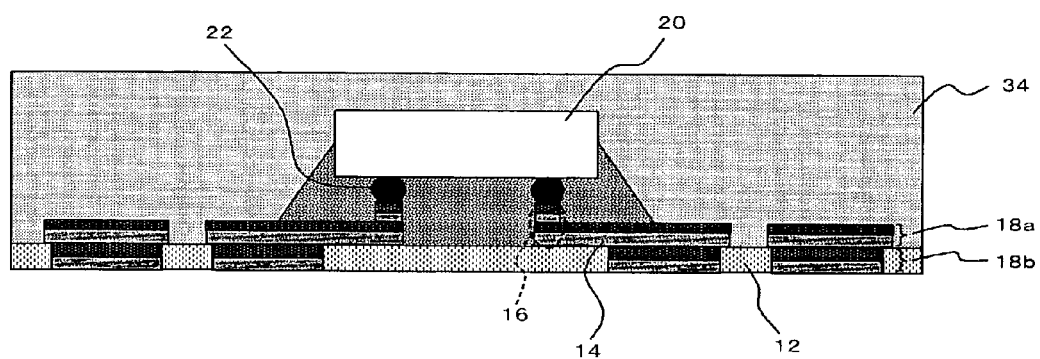
FIG. 7 is a cross-sectional view showing a manufacturing process of the electronic circuit device according to the embodiment.

Then the Cu layer 92 is also removed by etching (FIG. 7). Finally the solder bump 36 is formed on the lower pad metal layer 18b, by which the electronic circuit device 1 shown in FIG. 1 is obtained.

The manufacturing method according to this embodiment offers the following advantageous effects. According to the method, the interconnect substrate 10 is prepared in which a metal material (first metal material) having relatively high free energy for forming an oxide is exposed in the surface of the electrode pad 16, while another metal material (second metal material) having relatively low free energy is exposed in the surface of the interconnect 14. Accordingly, the surface of the interconnect 14 of the interconnect substrate 10 is more susceptible to oxidation than the surface of the electrode pad 16. Generally a metal oxide layer has lower solder-wettability than the metal, and hence the solder-wettability of the region of the interconnect 14 becomes lower than that of the region of the electrode pad 16 when the metal oxide layer is formed on the surface of the interconnect 14. Actually, on the interconnect 14 the metal oxide layer originating from the oxide of the second metal material is formed, as already stated.

Accordingly, the solder is prevented from flowing into the region of the interconnect 14 from the region of the electrode pad 16, when connecting the solder electrode 22 of the electronic circuit chip 20 to the electrode pad 16. Such method, therefore, eliminates the need to employ an interconnect substrate in which a solder resist is provided on the interconnect for preventing the solder from flowing over the interconnect 14. Consequently, unlike the electronic circuit device shown in FIG. 10, the restriction by the low patternability of the solder resist is no longer imposed on the connection of the interconnect substrate 10 and the electronic circuit chip 20 in a finer pitch. Thus, this embodiment provides a method of manufacturing appropriate for attaining an electronic circuit device having a structure that allows connecting the interconnect substrate 10 and the electronic circuit chip 20 in a finer pitch.

Further, since the solder electrode 22 is melted when connected to the electrode pad 16 in the connecting step, the use of the flux is no longer necessary for connecting the interconnect substrate 10 and the electronic circuit chip 20. Actually, in this embodiment the connection is performed without the intermediation of the flux. Accordingly, the metal oxide layer formed on the interconnect 14 can be prevented from being removed by the flux. The foregoing manufacturing method, therefore, further assures the prevention of the solder from flowing into the region of the interconnect 14.

Also, the solder-wettability in the region of the electrode pad 16 is higher than in the region of the interconnect 14. Therefore, secure connection is assured between the electrode pad 16 and the solder electrode 22.

Figure 10:
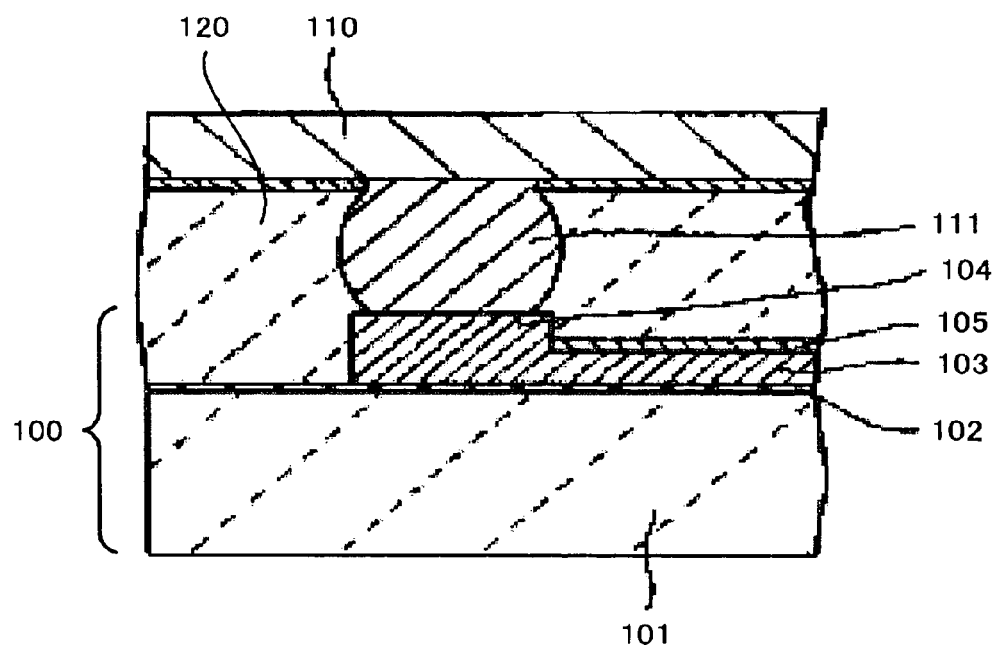
FIG. 10 is a cross-sectional view for explaining a conventional manufacturing method of an electronic circuit device.

Meanwhile, in the interconnect substrate 100 shown in FIG. 10, the electrode pad 104 and the solder resist 105 have to be separately patterned for the respective formation. This naturally leads to an increase in manufacturing cost of the interconnect substrate 100, and hence the electronic circuit device. Besides, in the case where the patterns are shifted from each other, the contact area between the semiconductor chip 110 and the solder electrode 111 becomes uneven, thereby degrading the reliability on the connection between the electrode pad 104 and the solder electrode 111. In contrast, the method according to this embodiment eliminates the need to provide the solder resist on the interconnect 14, thus providing solution of the foregoing problems.

Also, in the range corresponding to the height h1 from the insulating resin layer 12 (the height of the interconnect 14 from the insulating resin layer 12), the interconnect 14 and the electrode pad 16 have the identical layer structure. Accordingly, the integral structure of the interconnect 14 and the electrode pad 16 can be easily formed.

Au, Ag, Pt, and Pd are preferably employed as the first metal material. Cu and Ni are preferably employed as the second metal material.

Further, as described referring to FIG. 2, the interconnect 14 has a multilayer structure composed of the Cu layer 42a and the Ni layer 42b, and the electrode pad 16 has a multilayer structure composed of the Cu layer 42a, the Ni layer 42b, the Cu layer 42c, the Ni layer 42d and the Au layer 42e. Under such structure, the Ni layers 42b, 42d serve as the barrier metal for the Cu layers 42a, 42c respectively, thus preventing the eduction of Cu from the Cu layers 42a, 42c.

Executing the connecting step in an inert gas atmosphere allows preventing oxidation of the surface of the solder electrode 22 being heated up.

Figure 8:
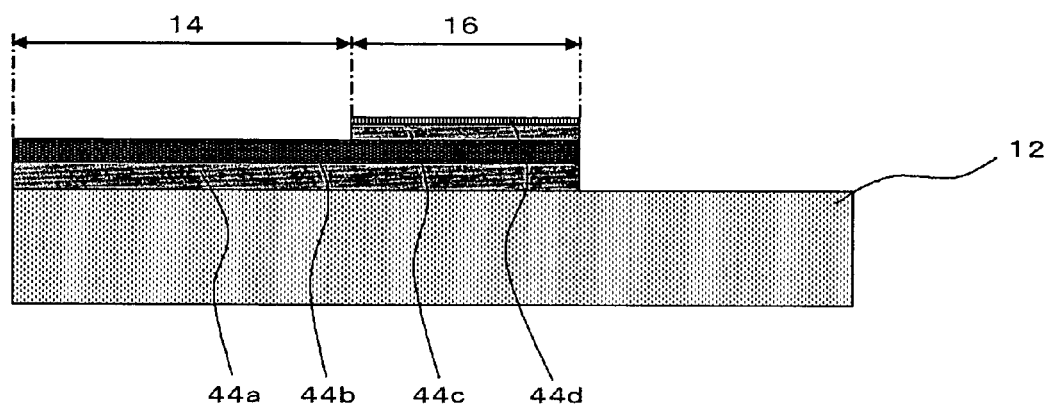
FIG. 8 is a cross-sectional view for explaining a variation of the embodiment.

The method of manufacturing an electronic circuit device according to the present invention is not limited to the foregoing embodiment, but various modifications may be made. To cite a few examples, the structure of the interconnect 14 and the electrode pad 16 in the interconnect substrate 10 prepared in the substrate preparing step is not limited to that described referring to FIG. 2. The electrode pad 16 may have a multilayer structure composed of, for example, a Cu layer 44a, a Ni layer 44b, a Cu layer 44c, and an Au layer 44d from the side of the insulating resin layer 12, as shown in FIG. 8. In FIG. 8, the multilayer structure of the interconnect 14 is composed of the Cu layer 44a and the Ni layer 44b shared with the electrode pad 16, as the structure shown in FIG. 2.

Figure 9:
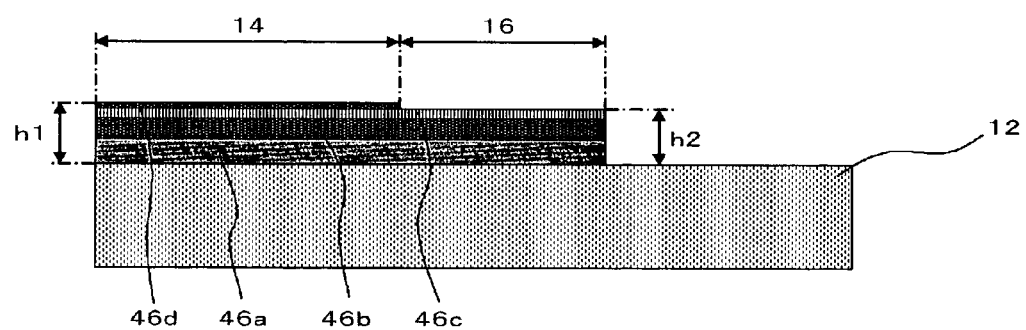
FIG. 9 is a cross-sectional view for explaining another variation of the embodiment.

Alternatively as shown in FIG. 9, the interconnect 14 may have a multilayer structure composed of a Cu layer 46a, a Ni layer 46b, an Au layer 46c and a Ni layer 46d from the side of the insulating resin layer 12, and the electrode pad 16 may have a multilayer structure composed of the Cu layer 46a, the Ni layer 46b and the Au layer 46c from the side of the insulating resin layer 12. In this variation, the interconnect 14 and the electrode pad 16 share the Cu layer 46a, the Ni layer 46b and the Au layer 46c. Also, the height h2 of the electrode pad 16 from the insulating resin layer 12 is lower than the height h1 of the interconnect 14 from the insulating resin layer 12. Accordingly, the interconnect 14 protrudes upward with respect to the electrode pad 16.

An interconnect substrate thus configured may be manufactured as follows. Firstly the structure shown in FIG. 4A is prepared. Then a multilayer structure composed of a Cu layer, a Ni layer and an Au layer is formed in the opening of the patterned photoresist, through similar steps to those described referring to FIG. 4B. After removing the photoresist, another photoresist is applied, and the reapplied photoresist is patterned so as to form the opening for the region of the interconnect 14. Then a plating process may be performed to form the Ni layer in the opening.

In the interconnect substrate shown in FIG. 9, the stepped portion formed at the boundary between the interconnect 14 and the electrode pad 16 serves to block the flow of the solder from the region of the electrode pad 16 toward the region of the interconnect 14, when connecting the solder electrode 22 to the electrode pad 16. Such structure further assures the prevention of the solder from flowing into the region of the interconnect 14.

Further, in a structure in which a metal layer constituted of the first metal material (in this example, the Au layer 46c) extends as far as the interconnect 14, as the interconnect substrate shown in FIG. 9, it is preferable to employ as the first metal material a metal having higher conductivity than the second metal material. Actually, in the foregoing example the first and the second metal material are Au and Ni respectively, so the first metal material has higher conductivity. Locating thus the metal layer having higher conductivity close to the surface layer of the interconnect 14 can suppress an increase in electrical resistance of the interconnect 14 against a high-frequency signal, because of skin effect.

It is apparent that the present invention is not limited to the above embodiment, and may be modified and changed without departing from the scope and spirit of the invention.

What is claimed is:

1. A method of manufacturing an electronic circuit device comprising:
   preparing an interconnect substrate including an interconnect provided on a base material, and an electrode pad integrally formed on said interconnect on said base material;
   preparing an electronic circuit chip including a solder electrode; and
   melting said solder electrode and connecting said solder electrode to said electrode pad, thus connecting said interconnect substrate and said electronic circuit chip;
   wherein a first metal material, exposed in a surface of said electrode pad opposite to said base material and constituting said electrode pad, has free energy for forming an oxide which is greater than free energy of a second metal material exposed in a surface of said interconnect opposite to said base material and constituting said interconnect.

2. The method according to claim 1, further comprising providing a metal oxide layer on said surface of said interconnect opposite to said base material, and
   wherein the metal oxide layer comprises an oxide of said second metal material.

3. The method according to claim 1, wherein said interconnect and said electrode pad have an identical layer structure in a range corresponding to a first height from said base material, when a height of said interconnect and a height of said electrode pad from said base material are different, and a relatively low height is denoted as said first height and a relatively high height is denoted as a second height.

4. The method according to claim 3, wherein said first and second heights are equal to said height of said electrode pad and said interconnect, respectively.

5. The method according to claim 4, wherein said first metal material has higher conductivity than said second metal material.

6. The method according to claim 1, wherein said first metal material is Au, Ag, Pt, or Pd, and said second metal material is Cu or Ni.

7. The method according to claim 1, wherein said interconnect comprises a multilayer structure composed of a Cu layer and a Ni layer from a side of said base material, or a multilayer structure composed of a Cu layer, a Ni layer and another Cu layer, and said electrode pad comprises a multilayer structure composed of a Cu layer, a Ni layer, another Cu layer and an Au layer from said side of said base material, or a multilayer structure composed of a Cu layer, a Ni layer, another Cu layer, another Ni layer and an Au layer.

8. The method according to claim 1, wherein said interconnect comprises a multilayer structure composed of a Cu layer, a Ni layer, an Au layer and another Ni layer from a side of said base material, and said electrode pad comprises a multilayer structure composed of a Cu layer, a Ni layer and an Au layer from said side of said base material.

9. The method according to claim 1, wherein said connecting of said interconnect substrate and said electronic circuit chip includes connecting said interconnect substrate and said electronic circuit chip without intermediation of a flux.

10. The method according to claim 1, wherein said connecting of said interconnect substrate and said electronic circuit chip includes connecting said interconnect substrate and said electronic circuit chip in an inert gas atmosphere.

11. The method according to claim 1, wherein the first metal material is different from the second metal material.

12. The method according to claim 1, wherein the first metal material is different from the second metal material.

13. A method of manufacturing an electronic circuit device comprising:
   preparing an interconnect substrate including a first metal material provided on a base material, and a second metal material integrally formed on the first metal material;
   preparing an electronic circuit chip including a solder electrode; and
   melting the solder electrode and connecting the solder electrode to the first metal material so as to connect the interconnect substrate and the electronic circuit chip,
   wherein the first metal material has free energy for forming an oxide which is greater than free energy of the second metal material.

14. The method according to claim 13, further comprising providing a metal oxide layer on a surface of the second metal material,
   wherein the metal oxide layer comprises an oxide of the second metal material.

15. The method according to claim 13, wherein the first metal material and the second metal material have a substantially identical layer structure in a range corresponding to a first height from the base material,
   wherein a height of the interconnect and a height of the electrode pad from the base material are different, and
   wherein a relatively low height is denoted as the first height and a relatively high height is denoted as a second height.

16. The method according to claim 15, wherein the first and second heights are equal to the height of the first metal material and the second metal material, respectively.

17. The method according to claim 16, wherein the first metal material has electrical conductivity greater than electrical conductivity of the second metal material.

18. The method according to claim 13, wherein the first metal material comprises one of Au, Ag, Pt, and Pd, and the second metal material comprises one of Cu and Ni.

19. The method according to claim 13, wherein the second metal material comprises a multilayer structure composed of a Cu layer and a Ni layer from a side of the base material or a multilayer structure composed of a Cu layer, a Ni layer and another Cu layer, and
   wherein the first metal material comprises a multilayer structure composed of a Cu layer, a Ni layer, another Cu layer and an Au layer from the side of the base material or a multilayer structure including a Cu layer, a Ni layer, another Cu layer, another Ni layer and an Au layer.

20. The method according to claim 13, wherein the second metal material comprises a multilayer structure composed of a Cu layer, a Ni layer, an Au layer and another Ni layer from a side of the base material, and the first metal material comprises a multilayer structure including a Cu layer, a Ni layer and an Au layer from the side of the base material.

* * * * *